United States Patent [19]

Seevinck et al.

[11] Patent Number: 5,351,011

[45] Date of Patent: Sep. 27, 1994

[54] LOW NOISE, LOW DISTORTION MOS AMPLIFIER CIRCUIT

[75] Inventors: Evert Seevinck, Eindhoven; Jacob H. Bolt, Hengelo, both of Netherlands

[73] Assignee: U.S. Philips Corporation, New York, N.Y.

[21] Appl. No.: 152,566

[22] Filed: Nov. 12, 1993

[30] Foreign Application Priority Data

Nov. 17, 1992 [EP] European Pat. Off. ......... 92203520.9

[51] Int. Cl.$^5$ ........................... H03F 3/45; H03F 1/26
[52] U.S. Cl. .................................. 330/253; 330/149
[58] Field of Search ................. 330/253, 149; 307/494, 307/497

[56] References Cited

U.S. PATENT DOCUMENTS 5,101,126  3/1992  Butler ................................. 330/253

FOREIGN PATENT DOCUMENTS 93207     4/1989  Japan ................................. 330/253
3286606  12/1991  Japan ................................. 330/253

OTHER PUBLICATIONS

ISSC74/ Feb. 14, 1974 Session XII: IC OP-AMP Techniques THPM 12.6: A Fast, High Precision, Laser–Trimmed FET OP-AMP.

"Analysis and Design of Analog Integrated Circuits", by Paul R. Gray and Robert G. Meyer, p. 720.

*Primary Examiner*—Steven Mottola
*Assistant Examiner*—Tiep H. Nguyen
*Attorney, Agent, or Firm*—Bernard Franzblau

[57] ABSTRACT

In the case of amplifier circuits realised in modern MOS technology, non-linear distortion occurs as a result of the high field strengths in the channel region due to the small dimensions. This distortion is eliminated and noise is reduced in that the amplifier circuit comprises a first series combination of first and second MOS transistors, and a second series combination identical with the first series combination and forming a long tailed pair circuit with the latter. The long tailed pair circuit includes an additional differential amplifier having its output connected to the gate electrode of a load transistor of the long tailed pair circuit by way of a voltage divider. The transistors in the long tailed pair circuit are mutually identical.

4 Claims, 1 Drawing Sheet

LOW NOISE, LOW DISTORTION MOS AMPLIFIER CIRCUIT

BACKGROUND OF THE INVENTION

This invention relates to a MOS technology amplifier circuit comprising a first series combination of the main current paths of a first and a second MOS transistor, the input of the amplifier circuit being coupled to the gate electrode of the first transistor, an output of the amplifier circuit being coupled to the drain electrode of the first transistor, and the gate electrode of the second transistor being coupled to its drain electrode.

A circuit of this type is known from the book entitled "Analysis and design of analog integrated circuits", 2nd Edn., by Paul R. Gray and Robert G. Meyer, published by John Wiley & Sons, more specif. FIG. 12.13(a).

The voltage gain of such an amplifier is determined by the ratios of the channel dimensions of the transistors and is approximately equal to the square root or this ratio expressed as $\sqrt{k'}$. Since said gain ratio is unequal to one, the gate-source voltage $V_{GS}$ of the first transistor is unequal to that of the second transistor.

In the saturation zone the current produced by the drain electrode to a modern technology MOS transistor is in a proper approximation equal to:

$$I_D = \beta_0/2 \, \frac{(V_{GS} - V_T)^2}{1 + \theta (V_{GS} - V_T)}, \text{ where}$$

$V_T$ is the power source electrode threshold voltage, $\beta_0 = \mu_0 C_{ox} \cdot (W/L)$, where $\mu_0$ is the average mobility of the load carrier in the channel region of a MOSFET transistor having a low channel field strength, $C_{ox}$ is the gate electrode capacitance per surface unit, W is the width and L the length of the channel region and $\theta$ is a mobility reduction factor occurring at higher channel field strengths.

Due to the reduction factor $\theta$ and the unequal gate-source voltage $V_{GS}$ of the two transistors, the gain is not linear, so that distortion occurs.

SUMMARY OF THE INVENTION

It is an object of the invention to reduce this distortion considerably. For this purpose, the amplifier circuit according to the invention comprises a second series combination identical to the first series combination and including the main current paths of a third and a fourth MOS transistor, another input of the amplifier circuit being coupled to the gate electrode of the third MOS transistor, the source electrodes of the first and third MOS transistors being intercoupled and coupled to a current source, the drain electrodes of the second and fourth MOS transistors being intercoupled, the drain electrodes of the first and third transistors being connected to a differential amplifier, the output of the differential amplifier being coupled to the output of the amplifiers and also, via a series combination of a first and a second resistor, to the drain electrodes of the second and fourth MOS transistors, the junction of the first and second resistors being coupled to the gate electrode of the fourth transistor, and the MOS transistors being mutually identical.

This amplifier circuit is advantageous in that the distortion due to the mobility reduction of the load carriers in the channel region is eliminated while a gain factor of the order of 10 to 100 still may be realised.

This amplifier circuit has the additional advantage that the gain factor is independent of the threshold voltage $V_T$ of the transistors.

According to a further embodiment of the invention, the differential amplifier circuit comprises a third series combination of the main current paths of a fifth and a sixth MOS transistor, a fourth series combination identical with the third series combination and including the main current paths of a seventh and an eighth MOS transistor. The source electrodes of the fifth and seventh MOS transistors are interconnected and, via a second current source, connected to the drain electrodes of the second and fourth MOS transistors, the gate electrodes of the fifth and seventh MOS transistors together forming the input to the differential amplifier, the gate electrodes of the sixth and eighth MOS transistors being intercoupled and coupled to the drain electrode of the eighth MOS transistor. The amplifier circuit also comprises a ninth MOS transistor whose source electrode is coupled to the source electrode of the sixth and eighth MOS transistors and to a power supply terminal, the gate electrode being coupled to the drain electrode of the sixth transistor, the drain electrode of the ninth MOS transistor forming the output of the amplifier circuit, and the fifth and seventh MOS transistors being complementary to the other MOS transistors.

This embodiment is advantageous in that the operational amplifier comprises a minimum number of components, has a good dynamic range and in that a low supply voltage is sufficient for the amplifier circuit to operate.

BRIEF DESCRIPTION OF THE DRAWING

The invention and its advantages will be further explained with reference to the embodiments shown in the accompanying drawing, in which.

DESCRIPTION OF THE PREFERRED EMBODIMENT

Figure 1:
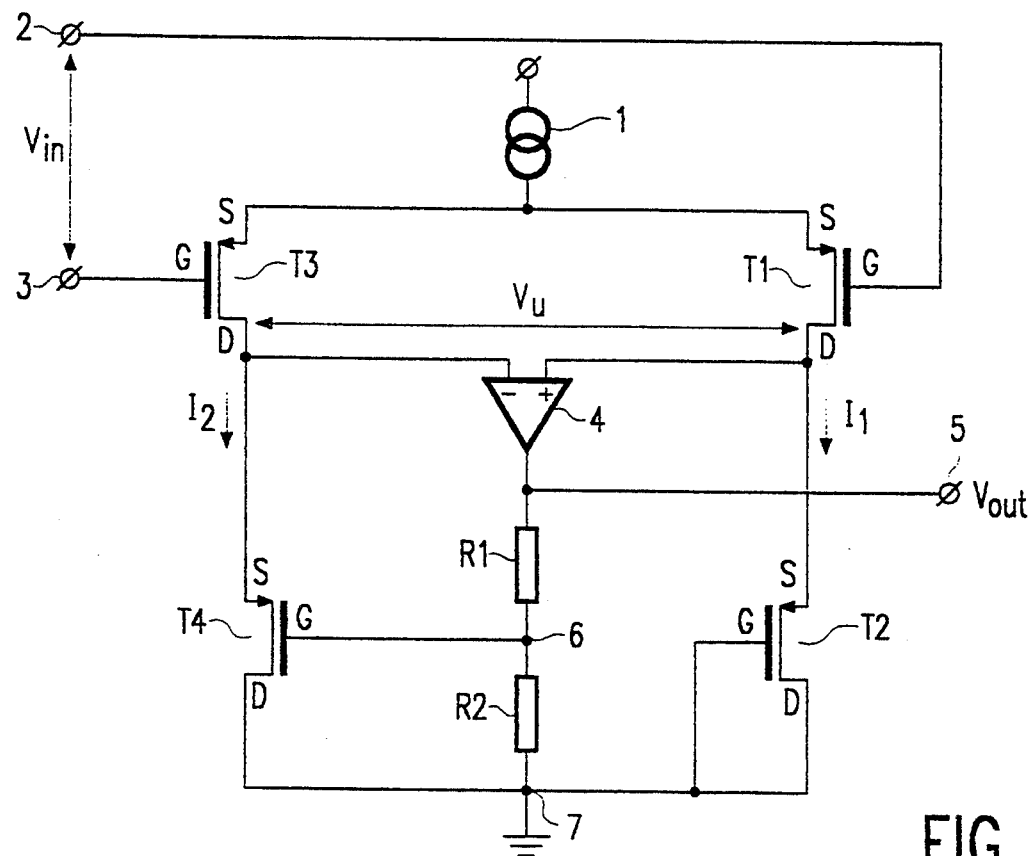
FIG. 1 shows an amplifier circuit according to the invention.

The basic circuit diagram of an amplifier circuit according to the invention shown in FIG. 1 comprises a first series combination of two MOSFET transistors including a first transistor $T_1$ and a second transistor $T_2$, a second series coremnation of two further MOSFET transistors including a third transistor $T_3$ and a fourth transistor $T_4$. The source electrodes of the transistors $T_1$ and $T_3$ are interconnected and connected to a current source 1 and form what is commonly referred to as a long tailed pair. An input voltage $V_{in}$ applied to the input terminals 2 and 3 of the amplifier is applied to the respective gate electrodes of the transistors $T_1$ and $T_3$. The transistors $T_2$ and $T_4$ form the loads on the transistors $T_1$ and $T_3$. For this purpose, the source electrodes of the transistors $T_2$ and $T_4$ are connected to the drain electrodes of the transistors $T_1$ and $T_3$, respectively, and the drain electrodes of the transistors $T_2$ and $T_4$ as well as the gate electrode of transistor $T_2$ are connected to a point of fixed potential 7 (ground).

The output voltage $V_u$ of the circuit described thus far is tapped between the drain electrodes of the transistors $T_1$ and $T_3$.

For the explanation of the operation of the amplifier circuit according to the invention it is first assumed that the gate electrode of the fourth transistor $T_4$ also is connected to ground, that the transistors $T_1$ and $T_3$ as well as the transistors $T_2$ and $T_4$ are mutually identical and that the geometric ratio W/L of the transistors $T_1$ and $T_3$ is in proportion to the geometric ratios of the transistors $T_2$ and $T_4$ to the ratio of K:1, W representing the width and L representing the length of the channel regions of the MOSFET transistors, so that:

$$\frac{W_1}{L_1} : \frac{W_2}{L_2} = K \text{ and that } \frac{W_3}{L_3} : \frac{W_4}{L_4} = K \tag{1}$$

For the current $I_D$ flowing through the MOSFET transistors it holds in a first approximation in the saturation zone that:

$$I_D = \frac{\beta}{2} \cdot (V_{GS} - V_T)^2 \tag{2}$$

where $V_T$ is a threshold voltage resulting from the integration process. $V_{GS}$ is the voltage between the gate and the source electrode, and $$\beta = \mu_n C_{ox} \frac{W}{L} \tag{3}$$

where $\mu_n$ is the average carrier (holes in this case) mobility in the channel region of the MOSFET transistor and $C_o$ is the gate electrode capacitance per surface unit.

From (2) it follows that:

$$V_{GS} = \sqrt{\frac{2I_D}{\beta}} + V_T \tag{4}$$

Furthermore, $$V_{in} = V_{GS1} - V_{GS3}$$

Substitution of (4) yields:

$$V_{in} = \sqrt{\frac{2I_1}{\beta_1}} - \sqrt{\frac{2I_2}{\beta_1}} \tag{5}$$

where $\beta_1$ of transistor $T_3$ is equal to $\beta_1$ of transistor $T_1$ due to the fact that the transistors are identical and thus also have equal W/L ratios.

Assuming that the gate electrode of transistor $T_4$ is also grounded, for $V_u$ it holds that:

$$V_u = V_{GS2} - V_{GS4} \tag{6}$$

Substitution of (4) and (6) yields that:

$$V_u = \sqrt{\frac{2I_1}{\beta_2}} - \sqrt{\frac{2I_2}{\beta_2}} \tag{7}$$

where $\beta_2$ comprises the factor $W_2/L_2$ which is identical for both transistors $T_3$ and $T_4$.

The gain factor is equal to:

$$A = \frac{V_T}{V_{in}} \tag{8}$$

Substitution of (1), (3), (5), and (7) yields:

$$A = \frac{V_T}{V_{in}} = \frac{1}{\sqrt{k}} \tag{9}$$

When MOS transistors are realised in modern technology, the channel dimensions are so small and the field strengths in the channel are consequently so large that the average electron mobility $\mu_n$ in formula (2) is no longer a constant value, but becomes dependent on the voltage difference $(V_{GS} - V_T)$. For $\mu_n$ it then holds that:

$$\mu_n = \frac{\mu_o}{1 + \theta (V_{GS} - V_T)} \tag{10}$$

where $\theta$ is a mobility reduction factor which is approximately equal to 0.2 $V^{-1}$. This mobility reduction factor $\theta$ in its turn depends on the channel dimension factor W/L. This should be taken to mean that formula (9) generally no longer holds. The gain factor A is in first instance equal to $$\sqrt{\frac{\beta_2}{\beta_1}}$$

due to the unequal mobility reduction factors $\theta_1$ and $\theta_2$ in (10) for (3) and shows that $\beta_1$ and $\beta_2$ have a value depending on the gate-source voltage $V_{GS}$ which causes distortion to occur. The invention compensates for this in that the transistors $T_1$ up to $T_4$ inclusive are all selected to be identical so that $V_{GS1} = V_{GS2}$ and $V_{GS3} = V_{GS4}$, and $\beta_2$ is then identical with $\beta_1$. This avoids distortion but it does not have the disadvantage of the gain A being equal to one because K=1.

In accordance with the invention the embodiment shown in FIG. 1 comprises an operational amplifier 4 whose inputs are connected to the drain electrodes of the transistors $T_1$ and $T_3$ and whose output, on the one hand, forms the output 5 carrying output voltage $V_{out}$ of the amplifier and, on the other, through a series combination of a first resistor $R_1$ and a second resistor $R_2$, is connected to ground. The junction of the resistors $R_1$ and $R_2$ is connected to the gate electrode of the fourth MOSFET transistor $T_4$.

Since the operational amplifier 4 continues to keep the voltages of the source electrodes of the transistors $T_2$ and $T_4$ equal to each other and since all of the transistors are identical, the following holds:

$$V_{out} \cdot \frac{R_2}{R_1 + R_2} = V_{GS2} - V_{GS4} = V_{GS1} - V_{GS3} = V_{in} \tag{11}$$

The gain of the amplifier circuit is therefore equal to:

$$A = \frac{V_{out}}{V_{in}} = \left(1 + \frac{R_2}{R_1}\right)$$

The factor $\theta$ is eliminated and, therefore, the distortion is very low. In addition, the noise of this amplifier is determined by the resistance ratio $R_1/R_2$ and is therefore low too. Besides, all input current of this amplifier is fully used, so that the amplifier needs to have little power. Furthermore, the gain factor does not depend on the threshold voltage $V_T$, although the amplifier circuit has a single-ended output.

Figure 2:
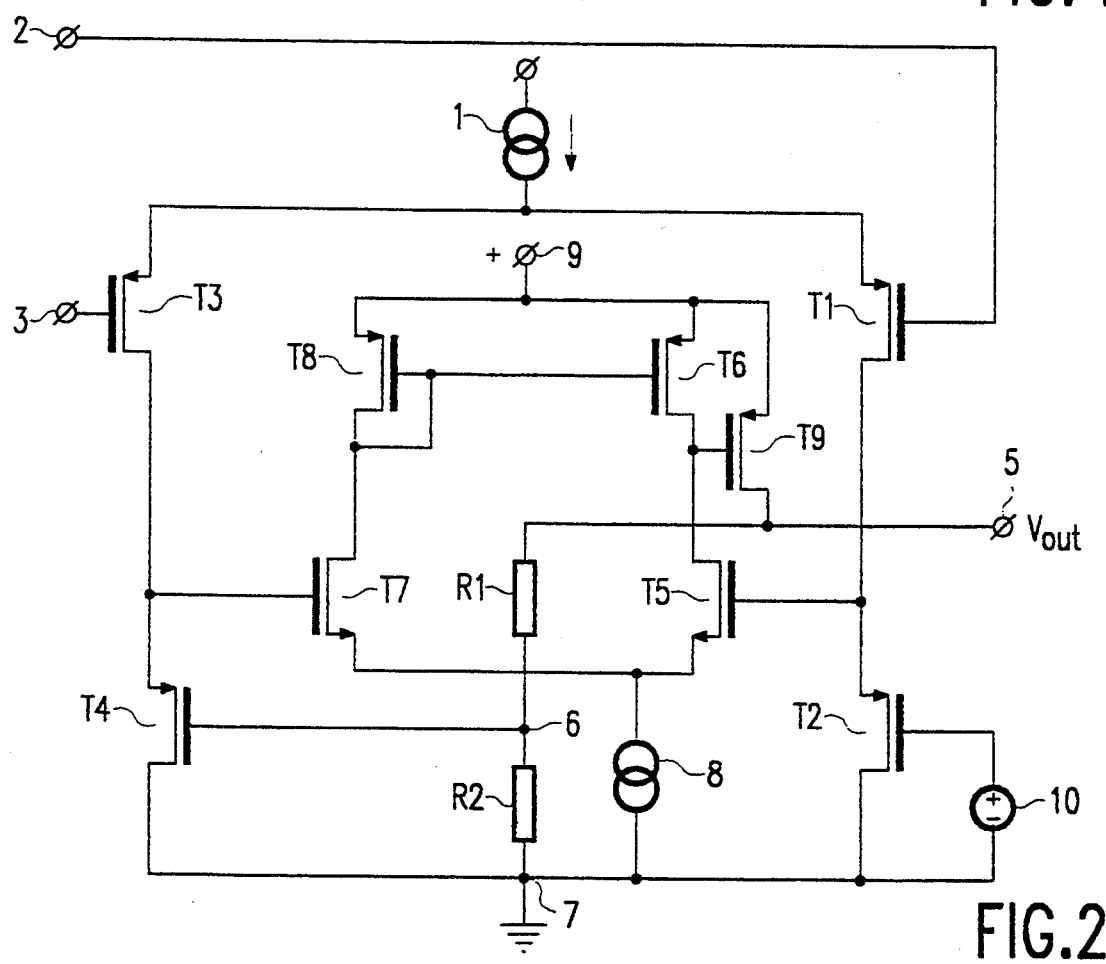
FIG. 2 shows a preferred embodiment of the amplifier circuit as shown in FIG. 1.

The amplifier circuit shown in FIG. 2 comprises a differential amplifier 4 known per se. This amplifier comprises what is commonly referred to as a long tailed pair circuit, formed by the mutually identical MOSFET transistors $T_5$ and $T_7$ whose source electrodes are interconnected and connected to ground via a current source 8. These transistors are complementary to the other transistors of the amplifier. The load of this long tailed pair circuit is formed by a current source circuit comprising a transistor $T_6$ included in a third series combination with transistor $T_5$, and a transistor $T_8$ arranged as a diode and included in a fourth series combination with transistor $T_7$, the gate electrodes of the transistors $T_6$ and $T_8$ being interconnected and the source electrodes of these transistors $T_6$ and $T_8$ being interconnected and connected to the positive terminal 9 of a power supply source (not shown). In addition, the operational amplifier 4 comprises an output transistor $T_9$ whose source electrode is connected to the positive supply terminal 9 and whose drain electrode forms the output 5 of the amplifier circuit.

A differential current caused by the input voltage $V_1$ is applied from transistor $T_5$ to transistor $T_9$ as a control voltage and presented in an amplified version on output terminal 5.

The use of this differential amplifier 4 in the amplifier circuit, according to the invention means that voltage level shifts are not necessary for realising the amplifier circuit. The amplifier circuit is therefore pre-eminently suitable for operation with a very low supply voltage. For realising an optimum drive of the amplifier circuit, it is possible to compensate for the voltage drop across the current source 8 by supplying the gate electrode of the second transistor $T_2$ with a reference voltage from a DC voltage source 10 coupled to the drain electrode of the sixth transistor, the drain electrode of the ninth MOS transistor forming the output of the amplifier circuit, and in that the fifth and seventh MOS transistors are complementary to the further MOS transistors.

We claim:

1. An MOS amplifier circuit comprising:
    a first series combination of main current paths of a first and a second MOS transistor, wherein an input of the amplifier circuit is coupled to a gate electrode of the first transistor, and a gate electrode of the second transistor is coupled to its drain electrode; and
    a second series combination of main current paths of a third and a fourth MOS transistor that is identical to the first series combination, wherein another input of the amplifier circuit is coupled to a gate electrode of the third MOS transistor, source electrodes of the first and third MOS transistors are intercoupled and are coupled to a first current source, drain electrodes of the second and fourth MOS transistors being intercoupled, drain electrodes of the first and third transistors being connected to a differential amplifier, an output of the deferential amplifier being coupled to an output of the amplifier circuit and also, via a series combination of a first and a second resistor, to the drain electrodes of the second and fourth MOS transistors, and a junction of the first and second resistors is coupled to a gate electrode of the fourth transistor, and in that the first to fourth MOS transistors are mutually identical.

2. Amplifier circuit as claimed in claim 1, wherein the differential amplifier circuit comprises:
    a third series combination of main current paths of a fifth and a sixth MOS transistor, a fourth series combination of main current paths of a seventh and an eighth MOS transistor that is identical to the third series combination, wherein source electrodes of the fifth and seventh MOS transistors are interconnected and coupled to the drain electrodes of the second and fourth MOS transistors via a second current source, gate electrodes of the fifth and seventh MOS transistors together forming inputs to the differential amplifier, gate electrodes of the sixth and eighth MOS transistors being intercoupled and being coupled to a drain electrode of the eighth MOS transistor; and
    a ninth MOS transistor having a source electrode coupled to source electrodes of the sixth and eighth MOS transistors and to a power supply terminal, a gate electrode coupled to a drain electrode of the sixth MOS transistor, and a drain electrode forming the output of the amplifier circuit, and wherein the fifth and seventh MOS transistors are complementary to the sixth and eighth MOS transistors.

3. The MOS amplifier circuit as claimed in claim 2, wherein said fifth and seventh MOS transistors are also complementary to the first, second, third and fourth MOS transistors.

4. The MOS amplifier circuit as claimed in claim 2, wherein the gate electrode of the second transistor is coupled to its drain electrode via a source of DC reference voltage.

* * * * *